(12) United States Patent
Ausserlechner et al.

(10) Patent No.: US 9,658,296 B2
(45) Date of Patent: May 23, 2017

(54) CURRENT SENSOR DEVICE

(71) Applicant: Infineon Technologies AG, Neubiberg (DE)

(72) Inventors: Udo Ausserlechner, Villach (AT); Volker Strutz, Tegernheim (DE); Jochen Dangelmaier, Beratzhausen (DE); Rainer Steiner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 315 days.

(21) Appl. No.: 13/939,113

(22) Filed: Jul. 10, 2013

(65) Prior Publication Data

US 2015/0015249 A1 Jan. 15, 2015

(51) Int. Cl.
*G01R 33/00* (2006.01)
*B29C 70/74* (2006.01)
*G01R 15/20* (2006.01)
*H01L 23/00* (2006.01)

(52) U.S. Cl.
CPC ........ *G01R 33/0047* (2013.01); *B29C 70/745* (2013.01); *G01R 15/20* (2013.01); *H01L 24/48* (2013.01); *H01L 2224/4809* (2013.01); *H01L 2224/48451* (2013.01); *H01L 2224/48465* (2013.01); *H01L 2924/00014* (2013.01); *H01L 2924/181* (2013.01)

(58) Field of Classification Search
CPC .. G01R 33/0047; G01R 15/20; G01R 33/072; G01R 33/07; G01R 33/02; H01L 24/48; H05K 3/28; H05K 3/30; B29C 70/745
USPC ................................. 324/252; 264/250, 268
See application file for complete search history.

(56) References Cited

U.S. PATENT DOCUMENTS

| | | | |
|---|---|---|---|
| 6,841,989 B2 | 1/2005 | Goto et al. | |
| 7,166,807 B2 | 1/2007 | Gagnon et al. | |
| 2002/0190703 A1* | 12/2002 | Goto et al. | 324/117 H |
| 2006/0091993 A1* | 5/2006 | Shoji | 338/32 R |
| 2009/0167288 A1* | 7/2009 | Reid et al. | 324/72 |
| 2010/0043222 A1* | 2/2010 | Wurzel et al. | 29/831 |
| 2011/0234215 A1* | 9/2011 | Ausserlechner | 324/244 |
| 2012/0112365 A1* | 5/2012 | Ausserlechner et al. | 257/777 |

* cited by examiner

*Primary Examiner* — Son Le
*Assistant Examiner* — Brent J Andrews
(74) *Attorney, Agent, or Firm* — Harrity & Harrity, LLP

(57) ABSTRACT

A current sensor device includes a casing having a cavity and a conductor fixedly mounted to the casing. A semiconductor chip configured to sense a magnetic field is arranged in the cavity. An electrically insulating medium is configured to at least partially fill the cavity of the casing.

24 Claims, 9 Drawing Sheets

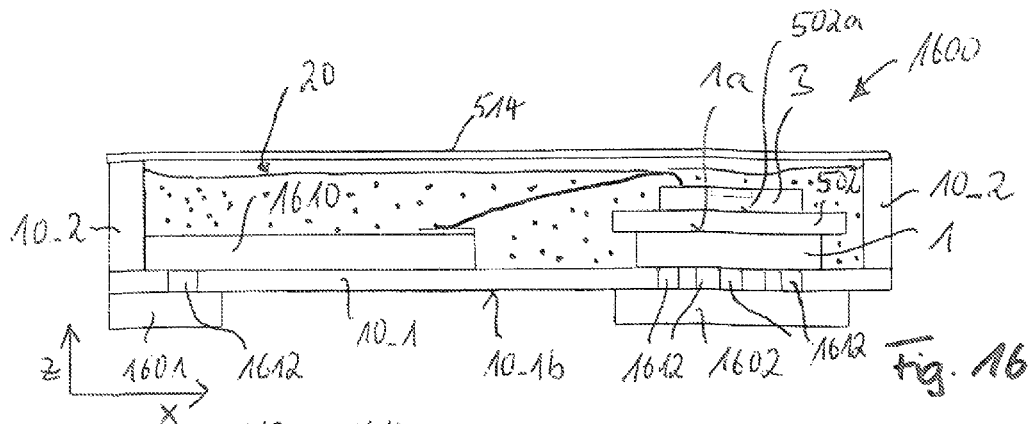
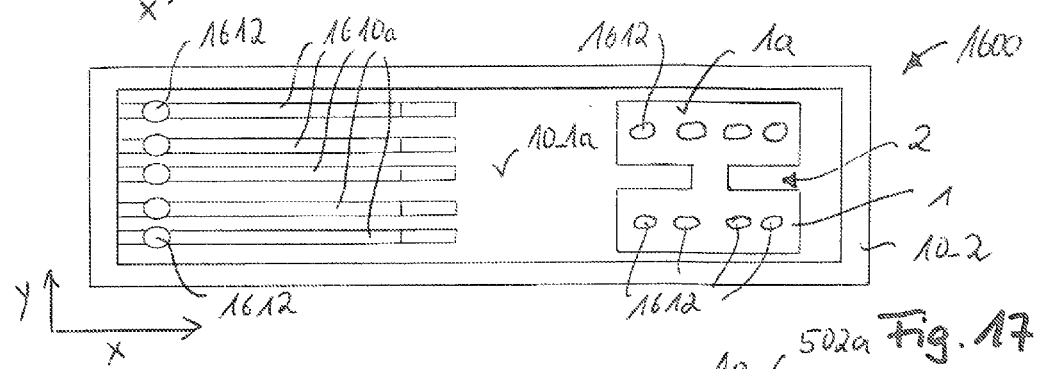
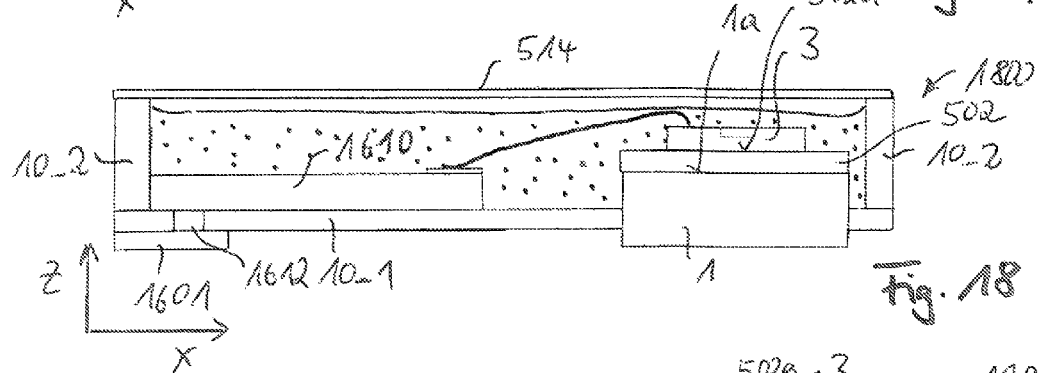
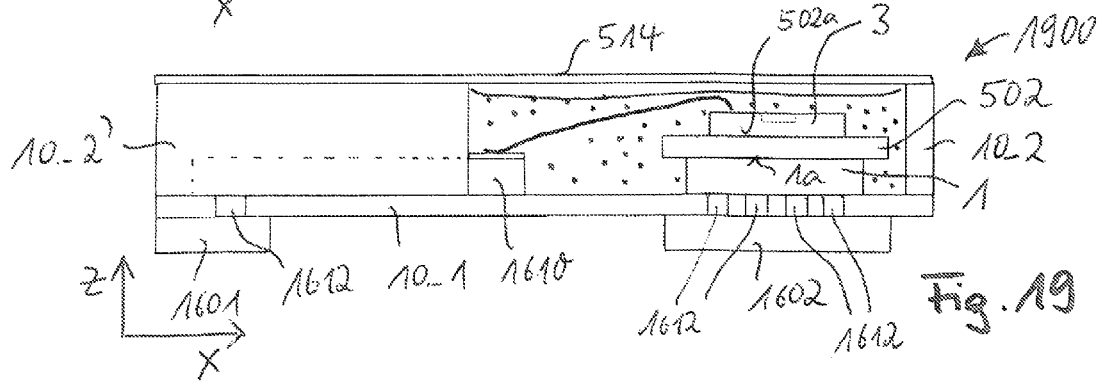

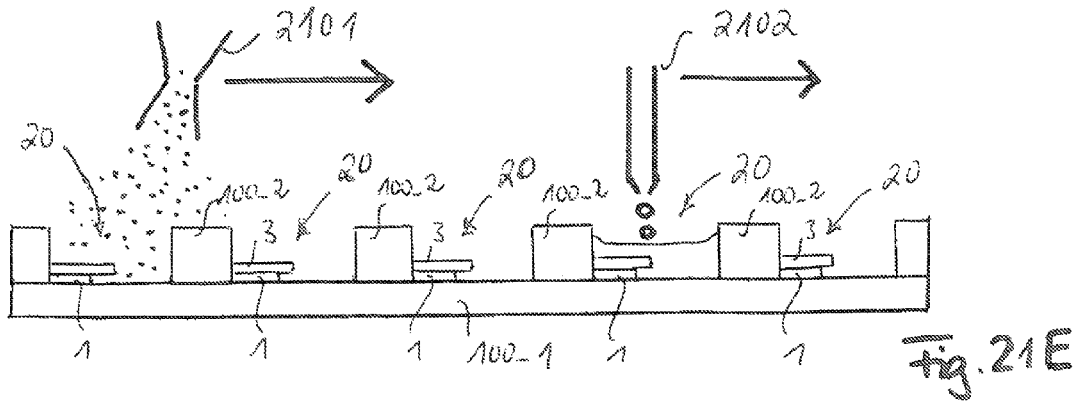
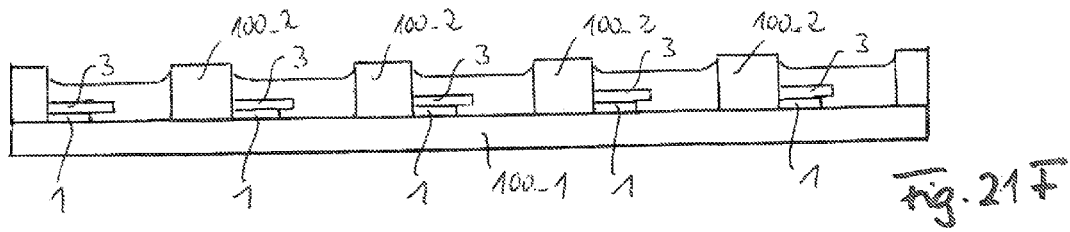
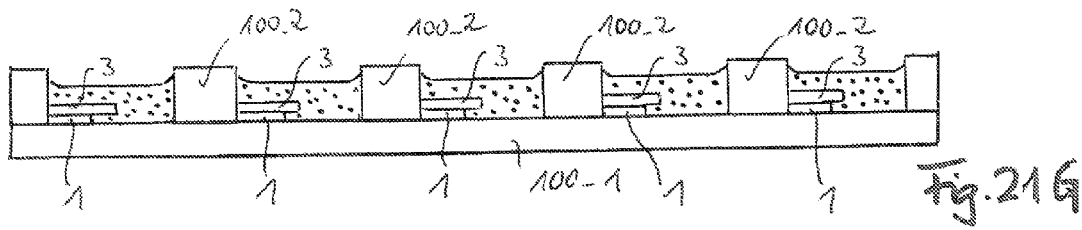
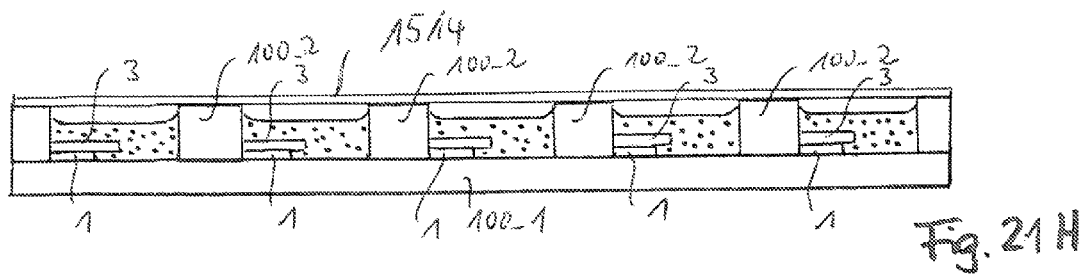
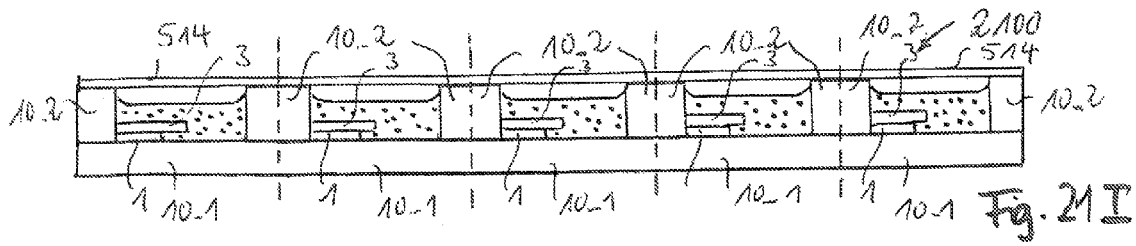

CURRENT SENSOR DEVICE

TECHNICAL FIELD

Embodiments described herein generally relate to the technique of current sensing, and more particularly to magnetic current sensor devices.

BACKGROUND

Magnetic current sensors detect the magnetic field caused by a current. A magnetic current sensor device may include a conductor and a semiconductor chip configured to sense the magnetic field produced by the current flowing through the conductor. Packaging also involves providing an electrical isolation between the semiconductor chip and the conductor. Devices providing high performance in view of sensitivity, lifetime, etc. at low expenses are desirable.

BRIEF DESCRIPTION OF THE DRAWINGS

The accompanying drawings are included to provide a further understanding of embodiments and are incorporated in and constitute a part of this specification. The drawings illustrate embodiments and, together with the description, serve to explain principles of embodiments. Other embodiments and many of the intended advantages of embodiments will be readily appreciated as they become better understood by reference to the following detailed description. The elements of the drawings are not necessarily drawn to scale relative to each other. Like reference numerals designate corresponding similar parts.

FIG. 16 schematically illustrates a cross-sectional view of an exemplary current sensor device.

FIG. 17 schematically illustrates a top view of a casing, a conductor and a redistribution structure of the current sensor device of FIG. 16.

FIG. 18 schematically illustrates a cross-sectional view of an exemplary current sensor device.

FIG. 19 schematically illustrates a cross-sectional view of an exemplary current sensor device.

FIGS. 21A-21I schematically illustrate cross-sectional views of an exemplary process of a method of manufacturing a current sensor device.

DETAILED DESCRIPTION

Figure 1:
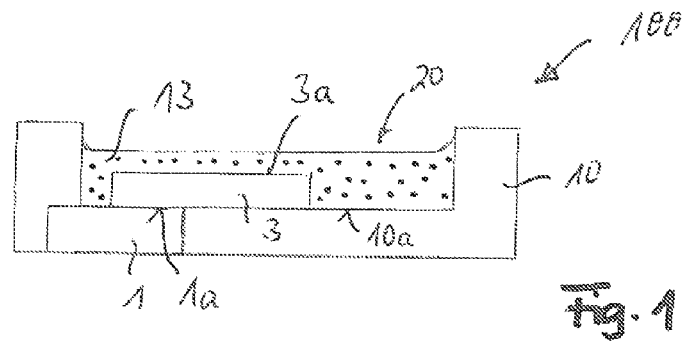
FIG. 1 schematically illustrates a cross-sectional view of an exemplary current sensor device.

In the following detailed description, reference is made to the accompanying drawings, which form a part thereof, and in which is shown by way of illustration specific embodiments in which the invention may be practiced. In this regard, directional terminology, such as "upper", "lower", "top", "bottom", "left", "right", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise or unless technically restricted.

As employed in this specification, the terms "bonded", "attached", "connected", "coupled", "electrically connected/electrically coupled", "covered" or derivatives thereof are not meant to mean that the elements or layers must directly be contacted together; intervening elements or layers may be provided between the "bonded", "attached", "connected", "coupled", "electrically connected/electrically coupled" elements or the "covered" and the covering elements or layers, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled", electrically connected/electrically coupled" or the "covered" and the covering element elements or layers, respectively.

The semiconductor devices described below contain one or more semiconductor chip(s) comprising at least one magnetic field sensitive element. The semiconductor chip(s) may be manufactured by various technologies and may include, for example, integrated electrical, electro-optical, or logical circuits and/or passives.

The semiconductor devices described below contain a cavity. The cavity is at least partially filled with an electrically insulating medium. The electrically insulating medium may, e.g., be a gel or a resin. By way of example, it may be a silica gel, a silicone gel, an epoxy-based resin (including epoxy-based derivatives or hybrides), or a polyurethane (PU).

After hardening, the electrically insulating medium may be hard or solid enough not to change its geometric shape anymore over lifetime. Further, it may have the property not to get brittle or disintegrated due to environmental impact, e.g., when exposed to radiation, when heated or when cooled. The electrically insulating medium may have a dielectric strength equal to or greater than 1 kV/mm, 5 kV/mm, 10 kV/mm, or 20 kV/mm. Further, the electrically insulating medium may provide for self-healing processes (e.g. silicone gel).

The electrically insulating medium may have a property of being resistant to temperature changes of the current sensor device over a range between, e.g. −50° C. and 150° C. Temperature changes may be caused by fabrication processes such as, e.g., soldering the current sensor device to a circuit board, by other external heat exposition or by heat dissipation during operation, e.g. caused by variable lifetime loads.

The electrically insulating medium may have a small magnetic susceptibility, e.g. equal to or less than 0.1, 0.01, 0.001, or 0.0001. Further, the electrically insulating medium may have few or no permanent magnetic moments, e.g. equal to or less than 0.1 emu, 0.01 emu, or 1 μemu.

The semiconductor chip(s) may have electrodes (or contact elements or contact pads) which allow electrical contact to be made with the integrated circuits or sensor area(s) included in the semiconductor chip(s). The electrodes may be arranged on one main surface of the semiconductor chip, e.g. at the main surface at which the magnetic field sensitive element is located or, e.g. if through vias are used, at the opposite main surface. The semiconductor chip may either be mounted in a flip chip orientation with the main surface at which the magnetic field sensitive element is located facing the bottom of a cavity or in a face-up orientation with the electrodes facing away from the bottom of the cavity.

The semiconductor devices described below may contain casing in which the cavity is formed. The casing may comprise or be a molded plastic part, in particular an integral molded plastic part. Various techniques may be employed to form the molded plastic part, for example compression molding, injection molding, powder molding or liquid molding. The (e.g. integral) molded plastic part may have side walls defining the recess and a bottom. The recess may be configured as a trough-shaped depression formed in the upper surface of the molded plastic part. The molded plastic part may, e.g., form the periphery of the current sensor device, i.e. may at least partly define the outer shape of the current sensor device.

The semiconductor devices described below contain an electrical conductor. The electrical conductor may be fixedly mounted to the casing. There are various techniques to fix the conductor to the casing. By way of example, if the casing is a molded plastic part, the electrical conductor may be integrated into the casing during molding. In other implementations, the electrical conductor may be attached to the casing after molding.

By way of example, the molded plastic part may, e.g., comprise or be made of at least one of a filled or unfilled mold material, a filled or unfilled thermoplastic material, or a filled or unfilled thermoset material.

By way of example, the casing and the electrical interconnects (e.g. the electrical conductor, electrical redistribution structures, terminal leads, etc.) may form, e.g., a so-called "molded interconnect device" (MID). MIDs are metallized molded parts. Due to their inherent design variability and structured metallizations, MIDs are typically able to combine the functionalities of a casing and an electrical contact carrier.

In other embodiments, the casing may be formed of at least two separate parts, e.g. a base part forming a bottom of the recess and a frame part forming a side wall of the recess.

The base part may, e.g., comprise or be formed of a laminate, a printed circuit board (PCB), in particular a single-layer PCB or a multi-layer PCB, a prepreg (short for pre-impregnated fibers), a cellulose material, e.g. paper, a glass material, or a ceramics substrate. The base part, in particular if provided by a laminate, a PCB, or a prepreg, may comprise or be made on the basis of, e.g., epoxy resin, PU (polyurethane) or polytetrafluoroethylene, and may include reinforcement means such as, e.g., aramid fibers, glass fibers or carbon fibers. More specifically, the base part may e.g. comprise or be made of a filled or unfilled laminate, a fiber-reinforced laminate, a fiber-reinforced polymer laminate, and a fiber-reinforced polymer laminate with filler particles.

Further, the base part of the casing may be made of or comprise a plate of ceramics coated with a metal layer, e.g. a metal bonded ceramics substrate. By way of example, the base part of the casing may be a so-called DCB (direct copper bonded) ceramics substrate.

The frame part may comprise or be made of, e.g., a laminate, a printed circuit board (PCB), in particular a single-layer PCB or a multi-layer PCB, a prepreg, or a ceramics substrate. The frame part, in particular if provided by a laminate, a PCB, or a prepreg, may comprise or be made on the basis of a resin, e.g., epoxy resin, PU (polyurethane), or polytetrafluoroethylene, and may include reinforcement means such as, e.g., aramid fibers, glass fibers or carbon fibers. More specifically, the base part may, e.g., comprise or be made of a filled or unfilled laminate, a fiber-reinforced laminate, a fiber-reinforced polymer laminate, and a fiber-reinforced polymer laminate with filler particles.

FIG. 1 illustrates an exemplary current sensor device 100. The current sensor device 100 comprises a casing 10 having a recessed structure completely surrounded by side walls, thus forming a cavity 20. The current sensor device 100 further comprises a semiconductor chip 3 arranged at least partly or completely in the cavity 20 and a electrical conductor 1 fixedly mounted to the casing 10. An upper surface 1a of the conductor 1 may, e.g., be at the same level with an upper surface 10a of the bottom of the cavity 20 of the casing 10. The semiconductor chip 3 contains at least one magnetic field sensitive element which is configured to sense a magnetic field which is created by a current flowing through the conductor 1. By way of example, the at least one magnetic field sensitive element may be located near an upper main surface 3a of the semiconductor chip 3. In other cases, when the semiconductor chip 3 is arranged in a flip-chip orientation, the at least one magnetic field sensitive element may be located at the main surface of the semiconductor chip 3 which faces the conductor 1. The magnetic field sensitive element of the semiconductor chip 3 is electrically insulated from the conductor 1.

Further, the current sensor device 100 comprises an electrically insulating medium 13 which at least partly fills the cavity 20 of the casing 10. The electrically insulating medium 13 may have a greater dielectric breakdown voltage than the material of the bottom of the cavity 20. The electrically insulating medium 13 serves to improve the dielectric strength of the current sensor device in order to avoid a voltage breakdown or partial discharge along surfaces which are covered by the electrically insulating medium 13. By way of example, at least some parts of the surface of the semiconductor chip 3, e.g. the side walls of the semiconductor chip 3 and, e.g., sawing edges thereof may be prone to voltage breakdown or partial discharge between the conductor 1 and the magnetic field sensitive element of the semiconductor chip 3 and may thus be covered by the electrically insulating medium 13. Avoidance of a voltage breakdown or partial discharge may be better than in conventional current sensor devices. In particular, the electrically insulating medium 13 may have the ability to avoid delamination at voltage breakdown or partial discharge critical interfaces. Delamination, if occurring at voltage breakdown or partial discharge critical interfaces in conventional current sensor devices, could lead to thin gaps at these interfaces which could fill with residual gas or other chemicals which could lower the breakdown voltage or the partial discharge hardness of conventional current sensor devices.

The breakdown voltage (or partial discharge voltage) across an insulating structure (not shown, various examples are disclosed further below) between the conductor 1 and the magnetic field sensitive element of the semiconductor chip 3 may be equal to or greater than 100 V, 1 kV, 2 kV, 3 kV, 5 kV, or 10 kV. The electrically insulating medium 13 may be provided to guarantee a specified breakdown voltage (e.g. as stated above) of the current sensor device 100 during lifetime of the device 100.

The electrically insulating medium 13 may be applied during manufacturing of the current sensor device 100 as a pourable substance, e.g. as a liquid, a spray or a powder. The cavity 20 of the casing 10 serves to collect the pourable substance in the vicinity of the semiconductor chip 3. Interfaces which are critical in view of voltage breakdown or partial discharge could be covered or sealed by the electrically insulating medium 13 and, therefore, the creation of delamination or gaps at such interfaces could be avoided.

By way of example, the cavity 20 may have a volume equal to or less than 1 cm$^3$, 0.1 cm$^3$, 0.01 cm$^3$, or 1 mm$^3$. Thus, the volume amount of electrically insulating medium 13 introduced into the cavity 20 may be equal to or smaller than these volumes.

As will be described in greater detail in the following, the conductor 1 may have a complex shape and/or a surface topology. By way of example, the conductor 1 may have a constriction and/or may have fine notches. Further, the conductor 1 may be inserted or embedded, e.g. molded, in the material of the casing 10. The recess 10 may be tight in order to avoid the electrically insulating medium 13, when liquid, to leak out of the recess 10. The electrically insulating medium 13 may be configured to creep into small notches, gaps, voids, etc. in order to fill such and other structures, which could potentially be critical in view of electrical breakdown, with the electrically insulating medium 13.

Typically, as already mentioned above and will be explained in more detail further below, the electrically insulating medium 13 may be applied as a pourable material (e.g. a liquid, a spray, or small solid particles) and is hardened, e.g. cured, after being introduced into the cavity 20.

The electrically insulating medium 13, when being liquid, may have a good wettability to surfaces inside the cavity 20. In particular, the electrically insulating medium 13 may have a good wettability to surfaces of the semiconductor chip 3, surfaces of the conductor 1, and surfaces of the casing 10. Further, it may have a good wettability to surfaces of an insulating member or layer (not shown in FIG. 1) which may be arranged between the conductor and the semiconductor chip 3. That way, the electrically insulating medium 13 may enter in all small niches, gaps, holes, cavities, etc. inside the cavity 20 in order to prevent trapped gas voids or other trapped chemicals, which could lead to discharge events at high electric fields. On the other hand, the cavity 20 may be tight with respect to liquids at least to a level to which the electrically insulating medium 13 fills the cavity 20. Further, the inner surface of the side walls of the cavity 20 may, at their top portion, have a lateral step acting as a barrier to prevent the electrically insulating medium 13, when being liquid, to creep out of the cavity 20.

The electrically insulating medium 13 may further have good adhesion to exposed surfaces inside the cavity 20 and, in particular, to the surfaces which are critical for voltage breakdown or partial discharge (e.g. the surfaces along which a large electrical field is present when the conductor 1 is at high voltage of, e.g., several kV and the semiconductor chip 3 is at, e.g., 0 V).

The electrically insulating medium 13 may be chemically inert with materials inside the cavity 20. By way of example, if the conductor 1 comprises e.g. copper and/or if an electrical interconnect inside the cavity 20 comprises e.g. gold, aluminum or nickel, the electrically insulating member insulating medium 13 may be chemically inert with these materials. Further, it may be chemically inert with an insulating member or layer within the cavity 20. By way of example, it may be chemically inert with a possible coating of the semiconductor chip 3, e.g. a hard passivation layer such as, e.g., a silicon oxide layer, a silicon nitride layer, a silicon oxide-nitride mixed layer, a polyimide coating, with an insulating member or layer comprising, e.g., ceramics, glass, a semiconductor material coated with an insulating layer (e.g. a silicon oxide layer, a silicon nitride layer, a silicon oxide-nitride mixed layer) and/or with solvents of adhesives used for the die attach of the semiconductor chip 3.

The current sensor device 100 may comprise further parts which will be described in conjunction with implementations shown in the following figures. In particular, the current sensor device 100 may comprise an insulating structure, e.g. an insulating layer or insulating member, configured to electrically insulate the semiconductor chip 3 from the conductor 1.

Figure 2:
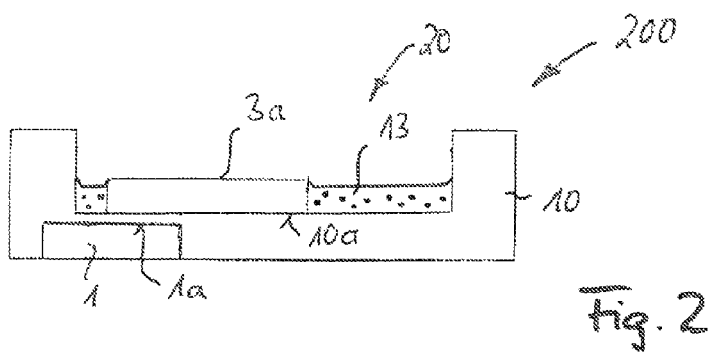
FIG. 2 schematically illustrates a cross-sectional view of an exemplary current sensor device.

FIG. 2 illustrates a current sensor device 200. The current sensor device 200 may be identical to the current device sensor 100 except that the surface 1a of the conductor 1 facing the cavity 20 is completely covered by the mold material of the casing 10. In other words, different to current sensor device 100, no part of the surface 1a of the conductor 1 is exposed in the cavity 20. The electrically insulating medium 13 may be filled up to a level beneath the upper main surface 3a of the semiconductor chip 3 facing away from the conductor 1. That way, the upper main surface 3a may remain uncovered by the electrically insulating medium 13. It is to be noted that also in current sensor device 100 of FIG. 1, a filling level of the electrically insulating medium 13 beneath the upper main surface 3a of the semiconductor chip 3 could be used.

Figure 3:
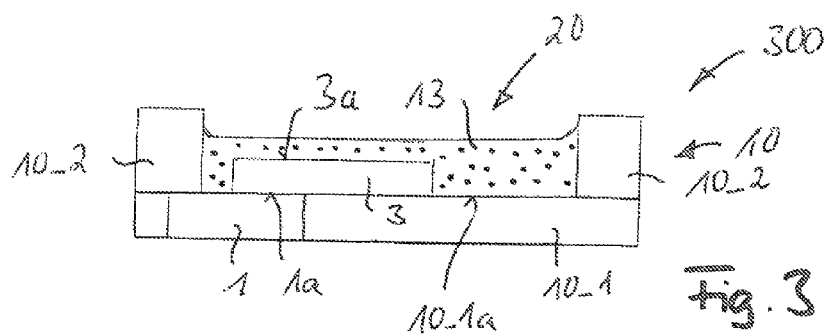
FIG. 3 schematically illustrates a cross-sectional view of an exemplary current sensor device.

FIG. 3 illustrates an exemplary current sensor device 300. The current sensor device 300 may be identical to the current sensor device 100 except that the casing 10 comprises at least two individual parts, e.g. a base part 10_1 forming a bottom of the cavity 20 and a frame part 10_2 forming a side wall of the cavity 20. The frame part 10_2 may be mounted on the base part 10_1 by any mounting technique such as, e.g., gluing, welding, thermo-bonding etc. Again, the cavity 20 may form a tight cavity configured to collect the electrically insulating medium 13 when applied as a pourable substance.

In the current sensor device 300 the base part 10_1 may comprise or be made of a material selected, e.g., from the group of a laminate, a prepreg, an epoxy-based material, and a ceramic. Further, the frame part 10_2 of the casing 10 may comprise or be made of a material selected, e.g., from the group of a laminate, a prepreg, an epoxy-based material, a ceramic, a molded plastic material, glass, and a semiconductor material. Again, as already described in conjunction with FIG. 1, the conductor 1 may be integrated or embedded within the base part 10_1 of the casing 10 or may be formed on an upper surface 10_1a of the base part 10_1 facing the cavity 20. Again, the upper surface 1a of the conductor 1 may partially be exposed at the bottom of the cavity 20. Further, as already mentioned in conjunction with FIG. 1, the semiconductor chip 3 may be electrically insulated from the conductor 1 (e.g. by an insulating chip attach layer not shown in FIG. 3).

Figure 4:
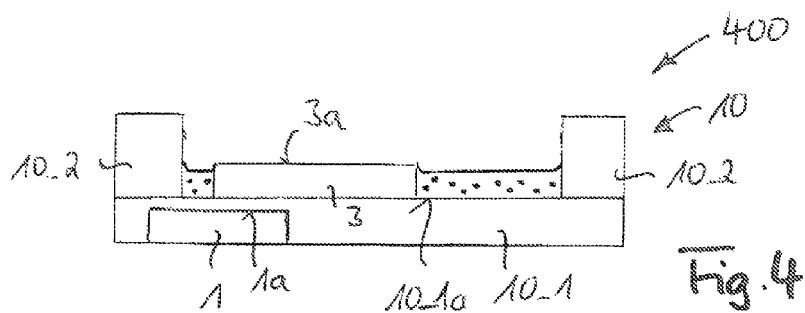
FIG. 4 schematically illustrates a cross-sectional view of an exemplary current sensor device.

FIG. 4 illustrates an exemplary current sensor device 400. The current sensor device 400 may be identical to the current sensor device 200 except that the casing 10 may be composed of at least the base part 10_1 and the frame part 10_2 as described in conjunction with FIG. 3. By way of example, the filling level of the electrically insulating medium 13 may, e.g., be beneath the upper main surface 3a of the semiconductor chip 3. For this or other reasons, the upper main surface 3a of the semiconductor chip 3 may be uncovered by the electrically insulating medium 13. The current sensor device 400 may, however, be configured to have a filling level of the electrically insulating medium 13 as shown in FIG. 3, and the current sensor device 300 of FIG. 3 may, e.g., be configured to have a filling level of the electrically insulating medium 13 as shown in FIG. 4. Reference is made to the above description in order to avoid reiteration.

Figure 5:
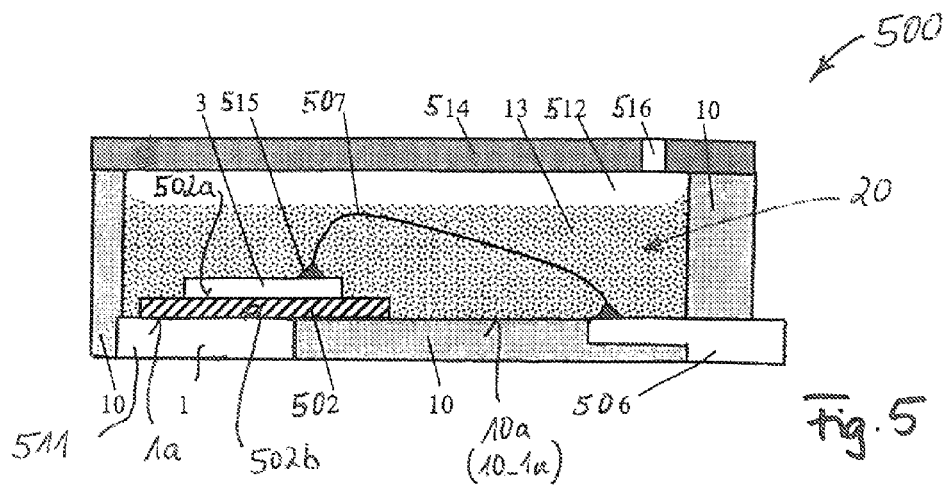
FIG. 5 schematically illustrates a cross-sectional view of an exemplary current sensor device.

FIG. 5 illustrates an exemplary current sensor device 500. In view of the casing 10, the current sensor device 500 may be designed as a pre-mold part in accordance with current sensor devices 100, 200 or as a casing 10 composed of at least two parts (base part 10_1 and frame part 10_2) in accordance with current sensor devices 300, 400.

In current sensor device 500 an insulating member 502 is arranged between the conductor 1 and the semiconductor chip 3. More specifically, a lower main face 502b of the insulating member 502 may be attached to the upper exposed surface 1a of the conductor 1 and a lower main surface 3b of the semiconductor chip 3 may be attached to an upper main surface 502a of the insulating member 502. The insulating member 502 may comprise or be made of a material selected from the group of, e.g., a glass, a semiconductor material, silicon oxide, a ceramic, a cellulose, e.g. paper, a polyimide, and a plastic material.

The upper surface 1a of the conductor 1 may level with an upper surface 10a of the bottom of the cavity 20. The insulating member 502 may extend both over a part of the upper surface 1a of the conductor and over a part of the upper surface 10a of the bottom of the cavity 20.

The current sensor device 500 may further comprise a lid 514, a first external terminal 506, second external terminals 511, and an electrical interconnect 507 electrically coupling an electrode of the semiconductor chip 3 to the first external terminal 506. The second external terminals 511 are electrically coupled to and, in particular, may be formed by the conductor 1. The first and second external terminals 506, 511 may be used to mount the current sensor device 500 to an application board. The electrical interconnect 507 may, e.g., be configured to be an internal electrical interconnect which entirely extends within the interior of the cavity 20. In other embodiments the electrical interconnect 507 may be an electrical interconnect (not shown) routed e.g. at least partly at an external surface of the casing 10.

By way of example, the (internal) electrical interconnect 507 may be a bonding wire. The bonding wire may, e.g., be bonded by a nail-head bond 515 to an electrode on the semiconductor chip 3. The nail-head bonding technique may cause the bonding wire 507 to have a bonding loop which may reach about 0.2 mm or 0.3 mm or more above the upper main surface 3a of the semiconductor chip 3.

As shown in FIG. 5, the filling level of the electrically insulating medium 13 may be as high as to completely cover the electrical interconnect (e.g. bonding wire) 507. In other implementations, the filling level of the electrical insulating medium 13 may be as high as to cover the bond (e.g. nail head bond) on the semiconductor chip 3 but as low as to leave at least a part of the electrical interconnect 507 (e.g. the loop of the bonding wire) uncovered by the electrically insulating medium 13. In still another implementation, as exemplarily shown in FIGS. 2 and 4, the filling level of the electrically insulating medium 13 may be as low as to leave the upper main surface 3a of the semiconductor chip 3 uncovered. Still, the side wall and all sawing edges of the semiconductor chip 3 as well as the top surface and the side wall and all sawing edges of the insulating member 502 may be covered by the electrically insulating medium 13. In still another implementation the insulating medium 13 may only cover the side wall and all sawing edges of the insulating member 502 completely or at least partially.

The lid 514 may close the cavity 20. The lid 514 may be attached, e.g. glued, welded or thermo-bonded to, e.g., the side walls or frame parts 10_2 of the casing 10. The lid 514 may be used to protect the current sensor device 500 against mechanical damage during handling, against dust, pollution, and partly against humidity and chemicals, and, e.g., also against light or radiation which could reach the semiconductor chip 3 (note that the electrically insulating medium 13 may be transparent or could be opaque; in the latter case, it may also serve to prevent light or radiation from reaching the semiconductor chip 3).

The lid 504 may have a hole 516. The hole 516 prevents pressure from being built-up in a void 512 possibly provided between the lid 514 and the electrically insulating medium 13. The hole 516 may, e.g., be located near the low voltage side, i.e. the side remote from the conductor 1 of the current sensor device 500. The hole 516 may be located in the vicinity of a corner of the current sensor device 500.

Figure 6:
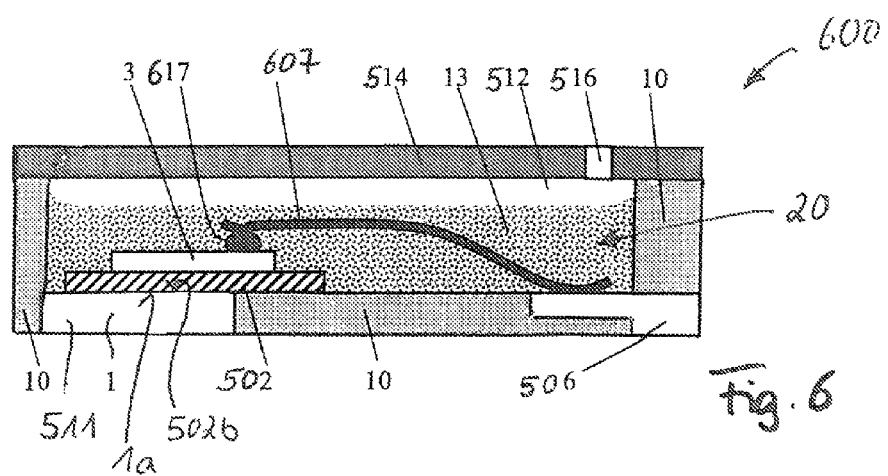
FIG. 6 schematically illustrates a cross-sectional view of an exemplary current sensor device.

FIG. 6 illustrates an exemplary current sensor device 600. The current sensor device 600 may be identical to, e.g., the current sensor device 500 except that the internal electrical interconnect 607 may have a height above the upper main surface 3a of the semiconductor chip 3 which is lower than the corresponding height of the electrical interconnect 507 of current sensor device 500. By way of example, the electrical interconnect 607 may be a wirebond which is bonded to the semiconductor chip 3 and the terminal 506 by using the wedge-on-bump technique. Thus, reference numeral 617 denotes a bump on top of an electrode (not shown) on the upper main surface 3a of the semiconductor chip 3. By way of example, the height of the filling level of the electrically insulating medium 13 over the upper main surface 3a of the semiconductor chip 3 may be less than 2 mm, 1 mm, or 0.5 mm. That way, the overall height of the current sensor device 600 and the amount of electrically insulating medium 13 needed could be reduced.

Figure 7:
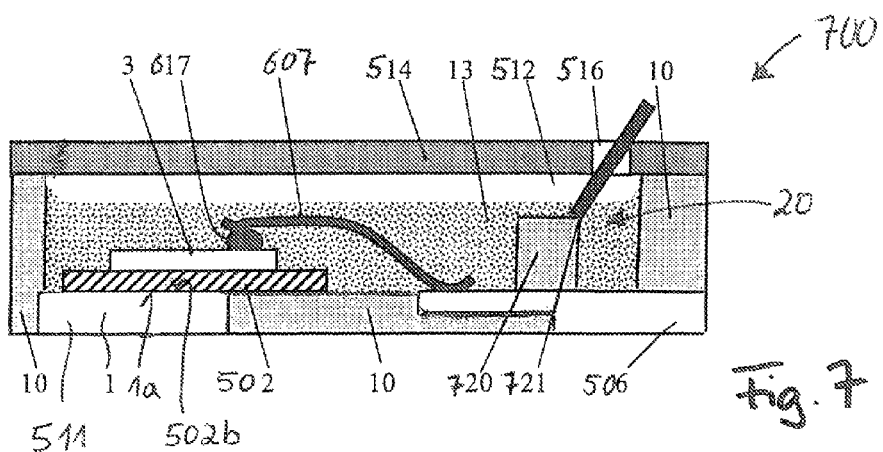
FIG. 7 schematically illustrates a cross-sectional view of an exemplary current sensor device.

FIG. 7 illustrates an exemplary current sensor device 700. The current sensor device 700 may be identical to, e.g., the current sensor device 600 except that the current sensor device 700 is provided with an obstacle 720. The obstacle 720 may be located in the interior of the cavity 20. The obstacle 720 may be configured to block a passage through the hole 516 in order to prevent a thin element such as, e.g., a needle or wire 721 to reach the internal electrical interconnect 607 if being e.g. accidently inserted into the hole 516. The obstacle 720 may be integrally molded with the casing 10. The obstacle 720 may also be connected or integrally formed (e.g. molded) to the lid 514, e.g. as a kind of a pre-mold labyrinth or protrusion projecting from the lid 514 into the cavity 20.

Figure 8:
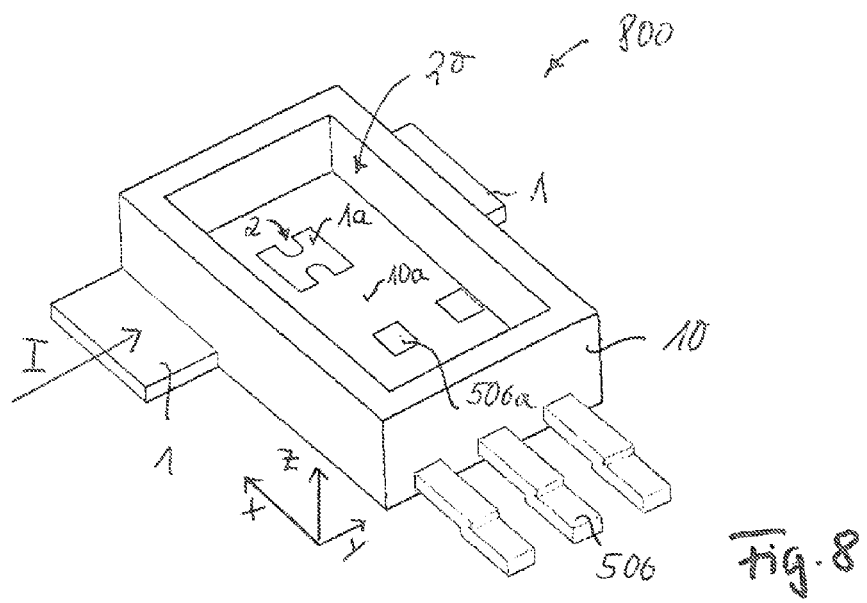
FIG. 8 schematically illustrates a perspective top view of a casing, a conductor and terminals of an exemplary current sensor device.

FIG. 8 illustrates a perspective top view of a current sensor device 800 at a stage of manufacturing, in which the semiconductor chip 3 and the insulating member 502 have not yet been placed into the cavity 20.

An upper surface 1a of a portion of the conductor 1 may be exposed at the bottom of the recess 10. Further, an upper surface 506a of the external terminal 506 may be exposed at the bottom of the cavity 20. The upper surface 1a and the upper surface 10a forming the bottom of the cavity 20 may define a common plane. The upper surface 506 of the external terminal 506 may, e.g., also be coplanar with this common plane.

In FIG. 8 as well as in the FIGS. 9 to 13, the casing 10 may be formed as a single integral molded plastic part as explained by way of example in conjunction with FIGS. 1 and 2. The side walls of the casing 10 may completely surround the cavity 20. Direction X defines the length dimension, direction Y defines the width dimensions and direction Z defines the height dimension of the casing 10. Although FIGS. 8 to 15 illustrate, by way of example, a pre-molded casing 10, the following description to FIGS. 8 to 15 may also be applicable to a casing 10 composed of at least a base part 10_1 and a frame part 10_2 as illustrated in FIGS. 3 and 4.

The conductor 1 may extend in direction Y. The first external terminals 506 may extend in direction X. The conductor 1 and the first external terminals 506 may be molded into the casing 10. The conductor 1 and the first external terminal (s) 506 may form part of a leadframe.

Here and in all other implementations, the conductor 1 may have a constriction 2. In current sensor device 800 the constriction 2 is provided in the exposed portion of the conductor 1. The current I to be sensed flows in direction Y through the conductor 1 and passes the constriction 2. The current I to be measured may, e.g., be equal to or greater than 5 A, 10 A, 30 A, 50 A, 80 A, or 100 A. The conductor 1 with the constriction 2 forms a low ohmic current path having, e.g., a resistance of equal to or less the 50 mΩ at, e.g., a maximum current of 5 A or having, e.g., a resistance of equal to or less the 2 mΩ at, e.g., a maximum current of 100 A. The resistance of the conductor 1 between the two terminals of the device (e.g. as shown in FIG. 8) may be equal to or greater than or lower than 400 µΩ, 200 µΩ, 100 µΩ, 50 µΩ, or 20 µΩ. The conductor 1 may e.g. be made of a bulk copper or aluminum material. The first external terminals 506 may, e.g., be formed as pins which supply the semiconductor chip 3 (not shown in FIG. 8) with power and which are used as signal pins to output the result of the current measurement. The conductor 1 and the first external terminals 506 are held together by the casing 10.

By way of example, the overall height in direction Z of the casing 10 may be equal to or less than or greater than 5 mm, 0.4 mm, 0.3 mm, or 0.2 mm. The overall length in direction X and/or the overall width in direction Y of the casing 10 may, e.g., be equal to or less or greater than 30 mm, 20 mm, 10 mm 5 mm or 3 mm. These dimensions may apply for all current sensor devices disclosed herein.

Figure 9:
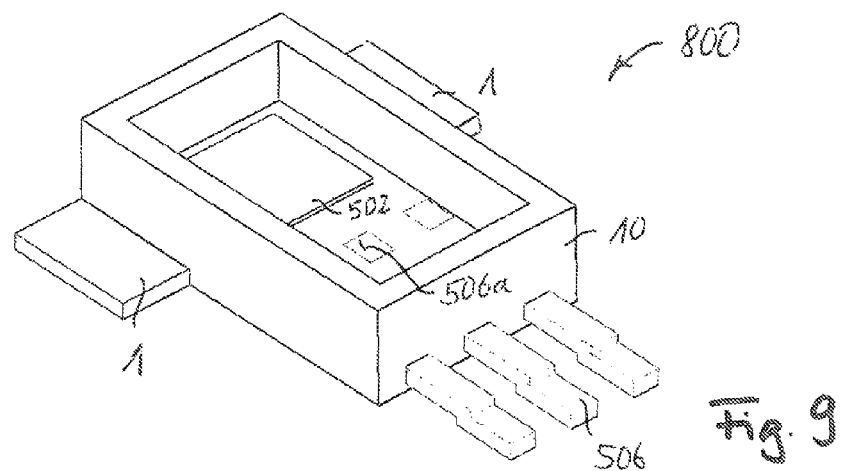
FIG. 9 schematically illustrates a perspective top view of the arrangement shown in FIG. 8, wherein a portion of the conductor is covered by an insulating member.
Figure 13:
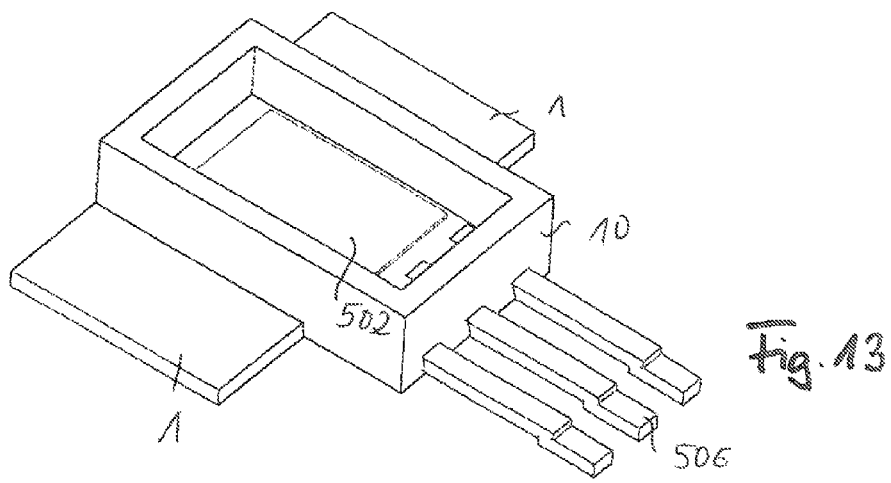
FIG. 13 schematically illustrates a perspective top view of the arrangement shown in FIG. 12, wherein a portion of the conductor is covered by an insulating member.

FIG. 9 illustrates the current sensor device 800 after the insulating member 502 has been placed over the exposed portion of the conductor 1. The insulating member 502 may, e.g., be a glass platelet or a flat silicon die with a dielectric isolation layer (e.g. silicon dioxide) on top. The dielectric isolation layer (not shown) may have a thickness equal to or greater than 10 µm, 15 µm, or 20 µm. The insulating member 502 may be glued to the exposed surface 1a of the conductor 1 and to the bottom surface 10a of the cavity 20 by using an adhesive (not visible in FIG. 9).

Figure 10:
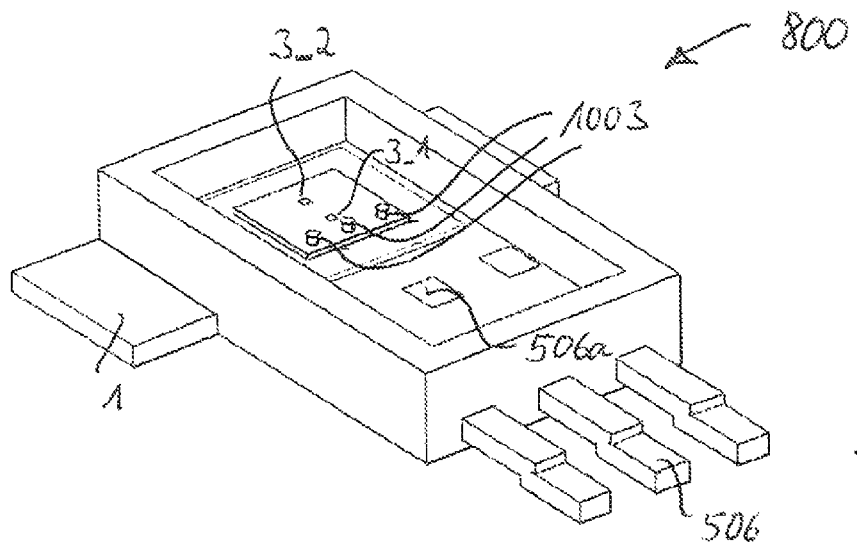
FIG. 10 schematically illustrates a perspective top view of the arrangement shown in FIG. 9, wherein a semiconductor chip is mounted over the insulating member.

FIG. 10 illustrates the current sensor device 800 after placing the semiconductor chip 3 over the insulating member 502. The semiconductor chip 3 may be mounted onto the insulating member 502 by using an adhesive layer (not visible in FIG. 10).

By way of example, the magnetic field sensitive element of the semiconductor chip 3 may integrate a plurality of magnet field sensing areas 3_1 and 3_2. In the following, by way of example, two magnet field sensing areas 3_1 and 3_2 may be assumed. The magnetic field sensing areas 3_1, 3_2, may, e.g., be implemented by Hall sensor devices, e.g. so-called Hall plates. The magnetic field sensing areas 3_1, 3_2 may be located left and right of the constriction 2 of the conductor 1 (in Z projection). The magnetic field sensing areas 3_1, 3_2 may be spaced apart by a distance (e.g. in X direction) equal to or greater than 0.5 mm, 0.6 mm, 0.8 mm, depending on the maximum current I for which the current sensor device 800 is to be specified. Each magnetic field sensing area 3_1, 3_2 may have a lateral dimension of about 0.1 mm.

As the constriction 2 may heat up due to the increase of current density, the chip electrodes (bond pads) should be placed under a certain distance from the constriction 2. By way of example, the semiconductor chip electrodes 1003 may be provided outside of a region or keep-out zone (KOZ) of about 0.6 mm or 0.8 mm around the center of the constriction 2. By way of example, the electrodes 1003 and thus, e.g., the bonds 515, 617 may be located along a perimeter of the semiconductor chip 3.

The center of the constriction 2 may e.g. be aligned with the center of the semiconductor chip 3 (in Z projection). Such placement of the semiconductor chip 3 and the magnetic field sensing areas 3_1, 3_2 provides a highest degree of symmetry and may provide for a high sensing performance.

It is to be noted that the geometry of the exposed portion of the conductor 1 may result in that the semiconductor chip 3 and, e.g., the insulating member 502 would not well be supported by the conductor 1 alone. In particular, this applies for the bonds 515, 617 at their KOZ off-center position, when pressure is applied during fabrication of these bonds. The common plane defined by the exposed portion 1a of the conductor 1 and the bottom surface 10a of the cavity 20 may establish a plane support directly underneath the chip electrodes (e.g. bond pads 515, 617). This support may prevent the generation of feeble cracks or other damages in the insulating member 502 (or in an insulating layer arranged, e.g., on top of the insulating member 502), which may, otherwise, be caused by the bonding process or by the introduction of stress into the semiconductor chip 3 through the electrical interconnect 507, 607. As feeble cracks or damages in the insulating member 502 or its top isolation layer may reduce the dielectric strength of the current sensor device, good mechanical support of the insulating member 502 and/or the semiconductor chip 3 arranged over the insulating member 502 could improve the yield, performance and lifetime of the current sensor device.

Figure 11:
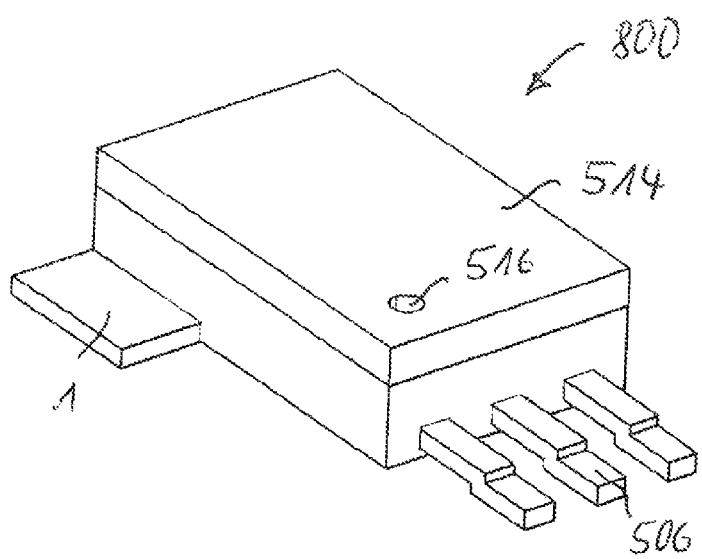
FIG. 11 schematically illustrates a perspective top view of an exemplary current sensor device.

FIG. 11 illustrates the current sensor device 800. By way of example, the cavity 20 is closed by a lid 514. A hole 516 passing through the lid 514 may be located in a peripheral region of the lid 514, e.g. in the vicinity of a corner of the lid 514.

Figure 12:
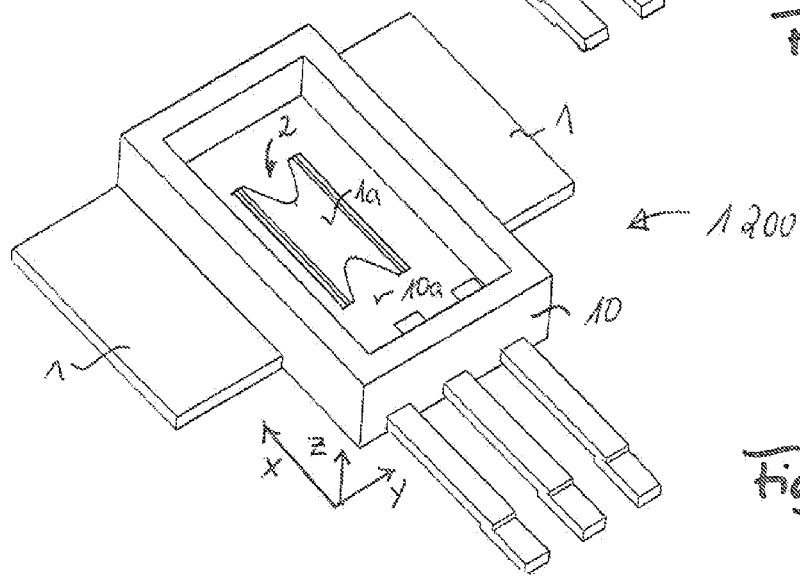
FIG. 12 schematically illustrates a perspective top view of a casing, a conductor and terminals of an exemplary current sensor device.

FIG. 12 illustrates a top view of a current sensor device 1200. The current sensor device 1200 may be identical to the current sensor device 800 except that the dimensions of the conductor 1 in X direction are greater than the corresponding dimensions of the conductor 1 in the current sensor device 800. Further, the insulating member 502 may have a greater length (in X direction) than the insulating member 502 of current sensor device 800, compare FIGS. 9 and 13. By way of example, the X dimension of the conductor 1 may be equal to or greater than half of the length of the casing 10, whereas in current sensor device 800, it may e.g. be equal to or less than half of the length of the casing 10. The X dimension of the constriction 2 may be equal to or greater than ⅓, ¼, or ⅕ of the length of the casing 10, whereas in current sensor device 800, it may e.g. be equal to or less than ⅓, ¼, or ⅕ of the length of the casing 10. Again, at least a portion of the upper surface 10a of the bottom of the cavity 20 may establish a plane surface lying in the same plane as the exposed portion 1a of the conductor 1. This may provide for ease of assembly (because e.g. the insulating member 502 and the semiconductor chip 3 may not fall off the exposed portion 1a of the conductor 1 during assembly) and for good stress absorption during assembly and/or operation.

Figure 14:
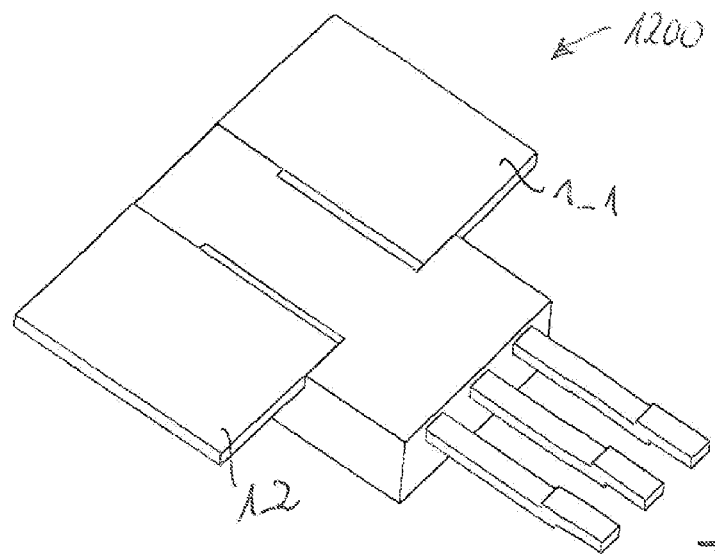
FIG. 14 schematically illustrates a perspective bottom view of the current sensor device of FIG. 12.
Figure 15:
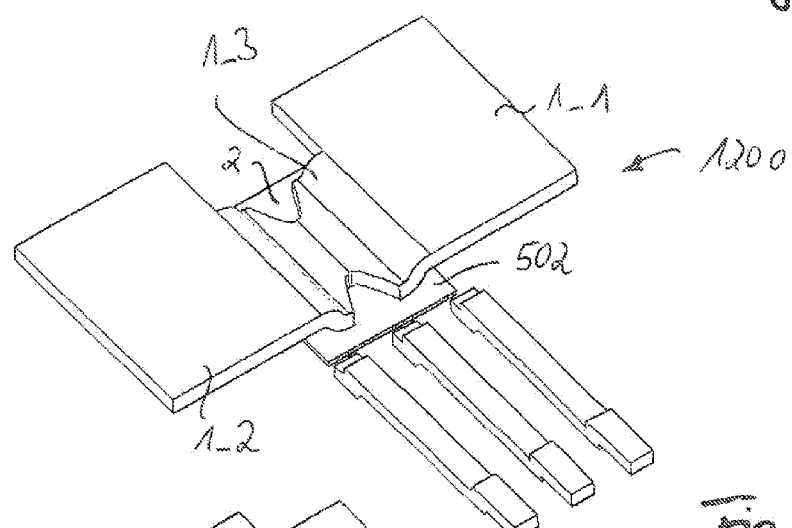
FIG. 15 schematically illustrates a perspective bottom view of the current sensor device of FIG. 12 without the casing being shown.

FIGS. 14 and 15 illustrate bottom views of the current sensor device 1200. In FIG. 15 the casing 10 is not depicted for illustrative purposes. As may be seen from FIGS. 14 and 15, the conductor 1 may comprise a first terminal or contact portion 1_1 and a second terminal or contact portion 1_2 as well as a bridge portion 1_3 interconnecting the first contact portion 1_1 and the second contact portion 1_2. The bridge portion 1_3 may be bent in Z-direction out of a common plane defined by bottom surfaces of the first contact portion 1_1 and the second contact portion 1_2. In a central region the bridge portion 1_3 may be designed to have the constriction 2, which may form part or represent the exposed portion 1a of the conductor 1.

The bridge portion 1_3 is designed to generate a strong magnetic field to act on the magnetic field sensitive element, e.g. the magnetic field sensing areas 3_1, 3_2. Further, the bridge portion 1_3 may be designed to generate a strong inhomogeneous magnetic field, i.e. near to the tips of the notches, a strong field of opposite polarity is formed. This inhomogeneity may allow to discriminate the inhomogeneous magnetic field to be measured from external homogeneous disturbances.

It is to be noted that the disclosure to FIGS. 8 to 15 may apply to all current sensor devices 100, 200, 500, 600, 700 as illustrated in FIGS. 1, 2, 5, 6, 7 and vice versa. Thus, FIGS. 1, 2, 5, 6, 7 may be understood to illustrate cross-sectional views along the X-direction of the current sensor devices 800, 1200 as illustrated in FIGS. 8 to 15. Further, the disclosure to FIGS. 8 to 15 may apply to the current sensor devices 300, 400 as illustrated in FIGS. 3, 4, except of the base part plus frame part construction of their casing 10.

FIG. 16 illustrates a cross-sectional view of a current sensor device 1600. The current sensor device 1600 is a device composed of at least the base part 10_1 and the frame part 10_2 of the casing 10 in accordance with current sensor devices 300, 400 (see FIGS. 3, 4). Thus, in order to avoid reiteration, the description to current sensor devices 300, 400 may also apply to current sensor devices 1600, 1800, 1900, and 2000 shown in FIGS. 16 to 20, and vice versa.

Returning to FIG. 16, the base part 10_1 may, e.g., be a laminate, a tape, a core of a printed circuit board, a prepreg, a plastic part, a molded part, etc. A first external terminal 1601 and/or a second external terminal 1602 may be arranged over a lower surface 10_1b of the base part 10_1. The first and second external terminals 1601, 1602 may be formed by structured metallizations, e.g. conductor paths provided at the lower surface 10_1b of the base part 10_1.

The first external terminal 1601 may be electrically coupled to an optional electrical redistribution structure 1610 arranged inside the cavity 20. The electrical redistribution structure 1610 may, e.g., be made of plated metal, a metal foil or, e.g., a leadframe attached over an upper surface 10_1a of the base part 10_1. By way of example, as shown in the top view of FIG. 17, the electrical redistribution structure 1610 may comprise a plurality of conductor paths 1610a extending along the X direction. The electrical redistribution structure 1610 or, more particularly, e.g., the conductor paths 1610a may be electrically connected to the first external terminal 1601 by a contact via 1612. The contact via 1612 may, e.g., comprise a hole passing through the base part 10_1 of the casing 10 and being plated, filled or partially filled by metal or other electrically conducting material.

At the high voltage side of the device the second external terminals 1602 may be electrically connected to the conductor 1 which provides a current path for the current to be measured. As illustrated in FIG. 17, the conductor 1 may have a constriction 2. The upper surface 1a of the conductor 1 may be planar. The conductor 1 may be formed by, e.g., plated metal, a metal foil, or a leadframe attached to the upper surface 10_1a of the base part 10_1. The conductor 1 may be electrically coupled to the external terminals 1602 by one or more contact vias 1612. The conductor 1 may be electrically coupled to two second external terminals 1602 of which only one is shown in the sectional view of FIG. 16.

By way of example, the base part 10_1b, the first and second external terminals 1601, 1602, the conductor 1 and, e.g., the electrical redistribution structure 1610 may be implemented by a double sided PCB design. Patterning of the conductive elements may be performed by chemical etching and/or plating, e.g. galvanic or electroless plating, and formation of the contact vias 1612 may be performed, e.g., by drilling and plating.

The insulating member 502 may be attached to the upper surface 1a of the conductor 1 by techniques mentioned herein before. The semiconductor chip 3 may be attached to the upper surface 502a of the insulating member 502 by techniques mentioned herein before. Further, the semiconductor chip 3 may be electrically coupled to the electrical redistribution structure 1610 by techniques described herein before, see e.g. current sensor devices 500 to 700 (FIGS. 5 to 7).

Other designs are possible. The semiconductor chip 3 may, e.g., be mounted on the insulating member 502 in a flip-chip orientation. By way of example, the electrical redistribution structure 1610 may extend in X direction as far as below the chip electrodes of the semiconductor chip 3 which may protrude over the outline of the insulating member 502. In this case, the semiconductor chip 3 may be electrically coupled to the redistribution structure 1610 without any interconnect in between (except a contact element such as, e.g., solder or a conductive adhesive used for flip-chip mounting).

The casing 10 (base part 10_1 and frame part 10_2) may be closed by a lid 514 by techniques described above. The cavity 20 is filled with the electrically insulating medium 13 up to an appropriate height as described herein before.

FIG. 18 illustrates a sectional view of a current sensor device 1800. The current sensor device 1800 may be identical to the current sensor device 1600 except that the conductor 1 and the second external terminal(s) 1602 are made of the same metallic element. By way of example, the metallic element forming the conductor 1 and the second external terminal(s) 1602 may be inserted into an opening in the base part 10_1 of the casing 10. The metallic element forming the conductor 1 and the second external terminal(s) 1602 may be H-shaped as in the top view of FIG. 17, with the two flanges of the H protruding in Y direction through the base part 10_1 as shown in FIG. 18. That way, a massive current path appropriate for high currents could be provided.

FIG. 19 illustrates a current sensor device 1900. The current sensor device 1900 may be identical to the current sensor device 1600 except that one side wall 10_2' of the frame part 10_2 may have a greater thickness than another side wall of the frame part 10_2. The side wall 10_2' of enlarged thickness of the casing 10 may improve mechanical strength and manageability of the casing 10, e.g. for facilitating pick-and-place operations of the current sensor device 1900. Simultaneously, the amount of electrically insulating medium 13 needed to fill the cavity 20 to a desired height is reduced.

Figure 20:
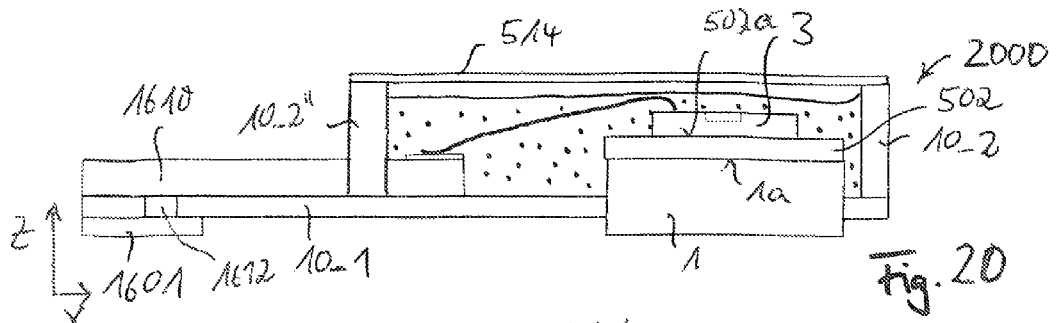
FIG. 20 schematically illustrates a cross-sectional view of an exemplary current sensor device.

FIG. 20 illustrates a current sensor device 2000. The current sensor device 2000 may be identical to the current sensor device 1600 except that a side wall 10_2" of the frame part 10_2 is located at a position spaced apart from the outline of the base part 10_1. That way, similar as in FIG. 19, a small amount of electrically insulating medium 13 may be used, and further, the amount of material needed for casing is optimized. The thickness of the side wall 10_2" may, e.g., be identical or similar to the thickness of the other side walls of the frame part 10_2. Without loss of generality, the high voltage side of the current sensor device 2000 is illustrated in accordance with the conductor design of FIG. 18. However, it could also be configured as shown in FIG. 16 or 19.

It is to be noted that the distance between the low voltage first external terminals 1601 and the high voltage second external terminals 1602 may be required to have a minimum length according to the rated isolation voltage. This minimum length is referred to as the external creepage distance and is given by industrial standardization. Thus, a minimum length of the device (i.e. the package) in X direction is given by the required isolation class. Using a cheap base part 10_1 material as exemplified above, an electrical redistribution structure 1610 to bridge the required distance in X-direction and a minimum amount of frame part 10_2 material and of electrically insulating medium 13 (i.e. a small cavity volume) may keep costs low.

Figure 21A:
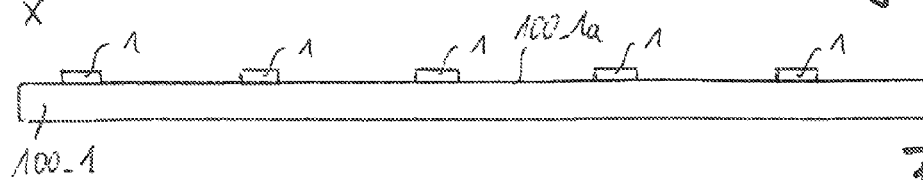

FIGS. 21A-21I schematically illustrate cross-sectional views of an exemplary process to manufacture a current sensor device 2100 as shown, e.g., in FIG. 21I. The current sensor device 2100 comprises a multi-part casing 10 including a base part 10_1 and a frame part 10_2 as described before. However, some of the processes described further below are also applicable for the manufacturing process of current sensor device using a single integral molded plastic part as a casing 10. Further, some of the processes described below may be omitted, may be performed in reversed order as described by way of example below or may be performed simultaneously.

In FIG. 21A a sheet-like base part structure 100_1 is provided. An array of conductors 1 may be provided on or over an upper surface 100_1a of the sheet-like base part structure 100_1.

The sheet-like base part structure 100_1 may contain holes into which parts of the e.g. profiled or bent conductor 1 can be inserted to obtain e.g. sensor devices as illustrated in FIG. 18. Thus, by way of example, terminal or contact portions of the conductor 1 may be arranged below the base part 10_1 and the magnetic field generation region of the conductor 1 between the terminal or contact portions may be located above the base-part 10_1.

Figure 21B:
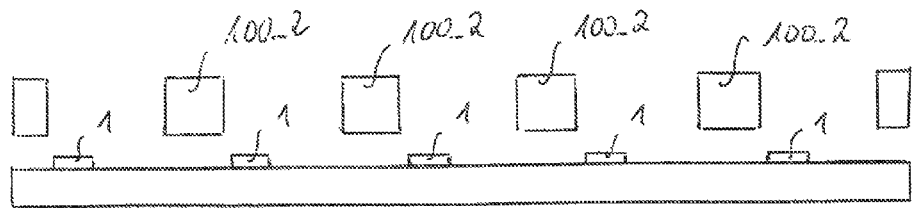
Figure 21C:
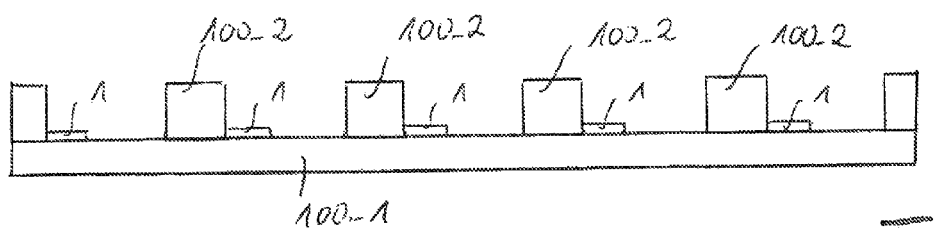

In FIG. 21B an array of frame parts 100_2 is aligned to and mounted on the sheet-like base part structure 100_1. The mounting of the array of frame parts 100_2 may be performed by gluing, laminating or other techniques as, e.g., mentioned before. In FIG. 21C the array of frame parts 10_2 is fixedly connected to the sheet-like base part structure 100_1.

The sheet-like base part structure 100_1 and the array of frame parts 100_2 may be made of materials which have been mentioned before in respect of the base parts 10_1 and the frame parts 10_2, respectively. The sheet-like base part structure 100_1 and the array of frame parts 100_2 may provide for a linear, one-dimensional array pattern or for a two-dimensional array pattern.

Figure 21D:
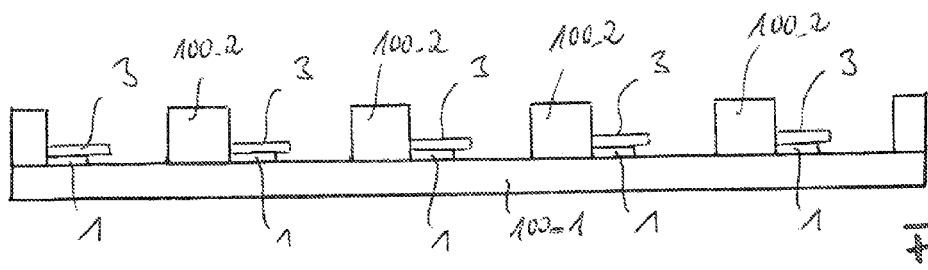

In FIG. 21D semiconductor chips 3 are mounted over the conductors 1. As mentioned before, an insulating member (not shown) may be provided between the conductor 1 and the semiconductor chip 3. Reference is made to all embodiments of the description mentioned before. This process could, e.g., also be performed prior to the processes of FIGS. 21B and 21C.

During or after mounting the semiconductor chips 3 over the conductors 1, the semiconductor chips 3 may be electrically connected to first outer terminals (not shown) as described herein.

FIG. 21E illustrates in a schematic fashion various methods of applying the electrically insulating medium 13. At this stage of the manufacturing process, the electrically insulating medium 13 is pourable, e.g. liquid or powdery. The electrically insulating medium 13 may be introduced, e.g. poured, sprayed, e.g. jet-sprayed, showered or dispensed into the recesses 20. By way of example, a nozzle 2101 may be used to spray or jet-spray the electrically insulating medium 13 onto the arrangement shown in FIG. 21E. That way, a jet or a mist of electrically insulating medium 13 may be generated which may cover all surfaces exposed in the recesses 20. The nozzle 2101 may be moved over the arrangement as shown by the arrow in FIG. 21E.

Further, e.g. a dispenser 2102 may be used to apply a metered amount of liquid electrically insulating medium 13 into each cavity 20. The dispenser 2102 may be moved over the arrangement as shown by the arrow in FIG. 21E. Other techniques may also be used to apply the electrically insulating medium 13 in liquid form.

It may be possible to apply the electrically insulating medium 13 in solid form, e.g. by pouring or showering particles such as, e.g., granules, flakes, powder or flour over the arrangement shown in FIG. 21E. It is also possible to introduce e.g. one or a predetermined number of solid particles or "pellets" into each cavity. There, these particles can be liquefied, e.g., by the application of energy such as, e.g., by exposing the particles to heat or radiation or by initiating a chemical reaction e.g. by exposing the particles to some reaction gas. Introducing the electrically insulating medium 13 into the recesses 20 and/or liquefying the electrically insulating medium 13 may be performed under vacuum.

Thus, in many cases the electrically insulating medium 13 becomes liquid inside the cavity at least in an intermediate process step. The electrically insulating medium 13, when being liquid (see FIG. 21F), may creep into all small niches, holes, recesses, cracks, notches, and may attach well to all surfaces (at least the voltage breakdown or partial discharge critical ones) because of its wetting ability and low viscosity. By way of example, the viscosity may be equal to or lower than 500 mPa*s, 450 mPa*s or 400 mPa*s. As the cavity 20 is leak-tight, the electrically insulating medium 13 does not leak out of the cavity 20 (e.g., small leakage may be admissible, as long as the amount of electrically insulating medium 13 can be controlled to cover e.g. all surfaces inside the cavity which are critical with respect to voltage isolation. This process of coating all exposed surfaces (up to a specific height) in the cavities 20 may be promoted by various additional processes such as, e.g., shaking and/or vibrating and/or tilting the arrangement shown in FIG. 21F.

In FIG. 21G the liquid electrically insulating medium 13 may be hardened, e.g. cured, to become solid (either hard solid or at least solid to an extent of an elastomer such as, e.g., rubber). The hardening or solidification may be assisted by the application of energy, e.g. heat, radiation, etc. After hardening the electrically insulating medium 13 may, e.g., be free of voids or gas/air blisters or gas/air bubbles. By way of example, the electrically insulating medium may then forma gel or a cured resin, e.g. epoxy resin.

Internal surfaces of the cavity 20 may thus be protected against electrical discharge over the whole lifetime of the current sensor device. More specifically, the elasticity of the electrically insulating medium 13 may prevent any formation of cracks along surfaces. Therefore, the approach of using a recessed, pre-fabricated casing 10 and filling this casing 10 with an electrically insulating medium 13 may provide substantial improvement over integrally molded casings, which are prone to voltage breakdown or partial discharge caused by loss of adhesion, crack-formation or even by so-called popcorning at critical surfaces inside the molded device.

In FIG. 21H a lid foil 1514 may be attached on top of the array of frame parts 100_2. The lid foil 1514 may, e.g., be applied by lamination. Before or after application of the lid foil a pattern of holes 516 (not shown in FIG. 21H) may be generated in the lid foil 1514. The optional lid foil 1514 may be non-conductive and may comprise or be made of materials mentioned above in the context of the casing 10 and the lid 514.

In FIG. 21I, the arrangement shown in FIG. 21H is separated into single current sensor devices 2100. Singulating may be performed by sawing, e.g. blade sawing, laser sawing, or cutting, milling, etching or other methods. The dashed lines in FIG. 21I indicate partition lines along separation streets (which may e.g. be predefined by break point lines). It is to be noted that singulating the sheet-like base part structure 100_1 and the array of frame parts 100_2 may also be performed at an earlier stage of the manufacturing process, e.g. during or after the process shown in FIG. 21G. It is also possible to singulate the sheet-like base part structure 100_1 and the array of frame parts 100_2 before filling the recesses 20 with the electrically insulating medium 13 (FIG. 21E).

Figure 22:
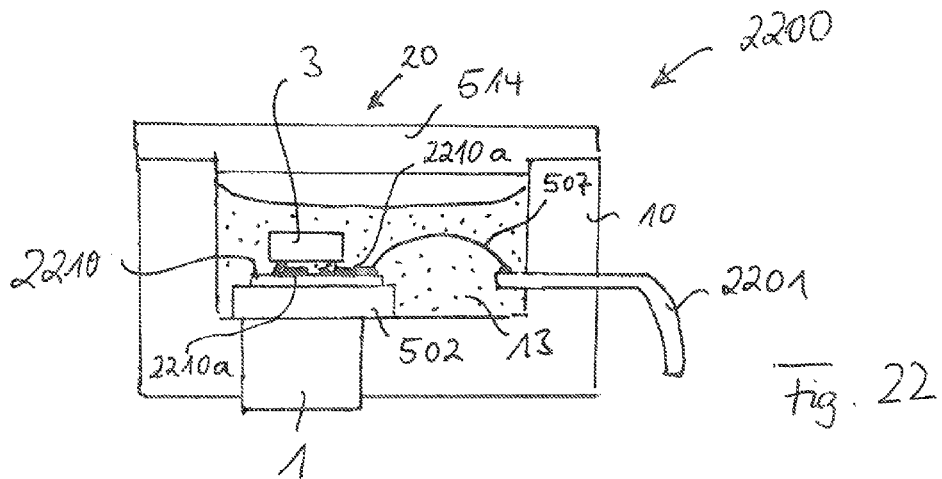
FIG. 22 schematically illustrates a cross-sectional view of an exemplary current sensor device.

FIG. 22 illustrates an exemplary current sensor device 2200. The current sensor device 2200 comprises a casing 10 having a cavity 20. The casing 10 may be designed according to any example implementation described above. The semiconductor chip 3 is arranged in a flip-chip orientation on an electrical redistribution structure 2210, i.e. the main surface of the semiconductor chip 3 near which the magnetic field sensitive element is located is the chip surface facing the electrical conductor 1. The electrical redistribution structure 2210 may comprise a polymer layer and conductor paths 2210a (similar to conductor paths 1610a of electrical redistribution structure 1610). The conductor paths 2210a are electrically connected to low voltage external terminals 2201 via, e.g., an electrical interconnect 507 as described above.

The electrical redistribution structure 2210 may be attached on the insulating member 502, which is arranged between the conductor 1 and the semiconductor chip 3. It is also possible that the conductor paths 2210a are directly deposited on the upper surface of the insulating member 502.

Here and in other implementations, the electrically insulating medium 13 may directly cover the exposed surfaces of the insulating member 502 (e.g. side surface, exposed portion of the upper surface), of e.g. the electrical redistribution structure 2210 (e.g. side surface, exposed portion of the upper surface), of e.g. the semiconductor chip 3 (e.g. bottom surface, side surface, upper surface). Further, the electrically insulating medium 13 may creep into any tiny gaps or delaminations between structural interfaces, e.g. between the bottom of the cavity 20 and the bottom surface of the insulating member 502, between the top surface of the insulating member 502 and the bottom surface of the electrical redistribution structure 2210. Further, the space between the surface of the semiconductor chip 3 facing the conductor 1 and the top surface of the electrical redistribution structure 2210 may be completely filled by the electrically insulating medium 13. Or, according to another possibility, a so-called underfill material as conventionally used in flip chip bonding may be used in this space before applying the electrically insulating medium 13.

Figure 23A:
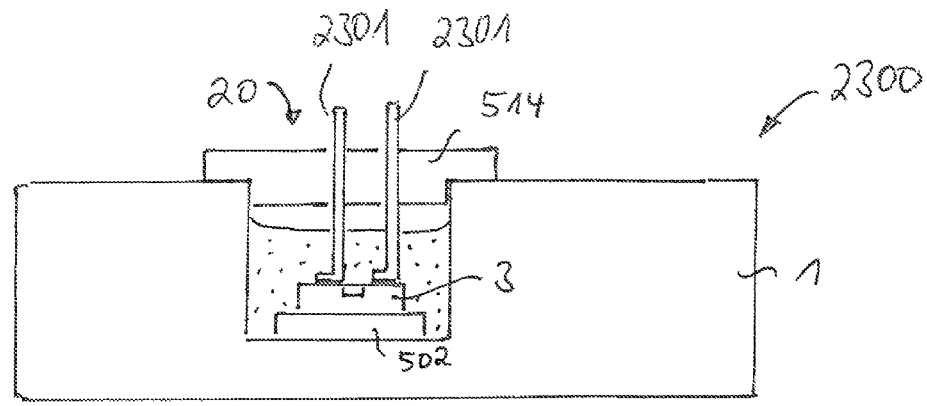
FIGS. 23A and 23B schematically illustrate a cross-sectional view and a top view, respectively, of an exemplary current sensor device.
Figure 23B:
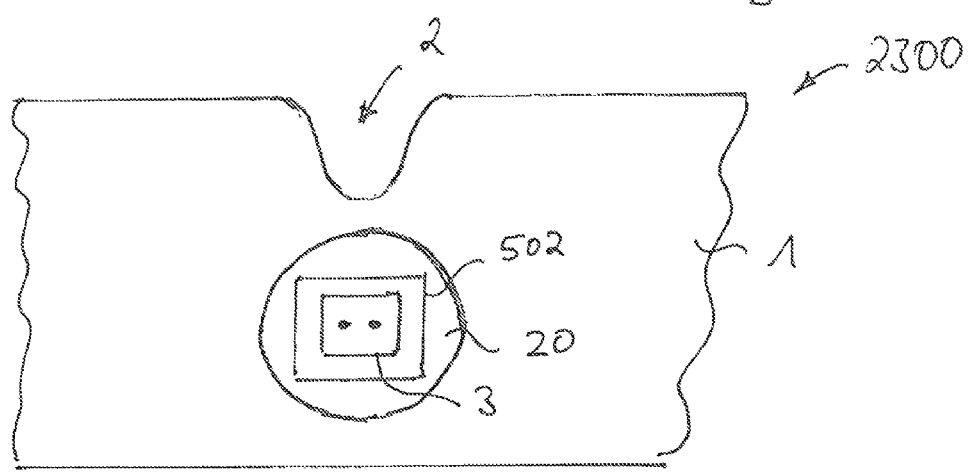

FIGS. 23A-23B illustrate an exemplary current sensor device 2300. The current sensor device 2300 may be similar in many respects to the other semiconductor devices described herein, and reference is made to the above description in order to avoid reiteration. However, the current sensor device 2300 comprises a cavity 20 which is formed in the conductor 1. Thus, no casing is needed or provided to form a cavity and/or to hold the conductor 1 in a fixed position in the vicinity of the cavity.

The insulating member 502 may be arranged between the conductor 1 (e.g. the bottom of the cavity formed by the conductor 1) and the semiconductor chip 3. That way, e.g., the magnetic field sensitive element is electrically insulated from the conductor 1. Chip electrodes on the upper main surface of the semiconductor chip may be electrically connected to low voltage external terminals 2301. The magnetic field sensitive element may be located near the upper chip surface facing away from the bottom of the cavity 20. The constriction 2 may be arranged in the vicinity of the cavity 20 (see FIG. 23A). Again, the electrically insulating medium 13 may at least partially fill the cavity 20 and covers at least a part of the surface of the semiconductor chip 3. In particular, all critical surfaces (such as, e.g. the side wall surfaces and/or the cutting edges) may be covered with the electrically insulating medium 13.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A current sensor device, comprising:
a casing having a cavity;
a conductor fixedly mounted to the casing;
a semiconductor chip arranged at least partly in the cavity,
the semiconductor chip including a magnetic field sensitive element, wherein the magnetic field sensitive element is electrically insulated from the conductor; and
an electrically insulating non-gaseous medium to prevent a voltage breakdown or a partial discharge on a part of a side wall of the semiconductor chip covered by the electrically insulating non-gaseous medium,
the electrically insulating non-gaseous medium at least partially filling the cavity, and
the electrically insulating non-gaseous medium being formed of a material that has a greater dielectric breakdown voltage than a dielectric breakdown voltage of a material from which the casing is formed.

2. The current sensor device of claim 1, wherein the casing is formed from a single integral part.

3. The current sensor device of claim 2, wherein the casing is a molded plastic part.

4. The current sensor device of claim 1, wherein the casing comprises a base part forming a bottom of the cavity and a frame part forming a wall of the cavity.

5. The current sensor device of claim 4, wherein the base part comprises a material including at least one of a laminate, a prepreg, an epoxy-based material, a plastic, a molded plastic material, a cellulose, a glass, or a ceramic.

6. The current sensor device of claim 4, wherein the frame part comprises a material including at least one of a laminate, a prepreg, an epoxy-based material, a ceramic, a plastic, a molded plastic material, or glass.

7. The current sensor device of claim 1, wherein the material from which the electrically insulating non-gaseous medium is formed is a gel, a silica gel, a silicone gel, a resin, an epoxy-based resin, or a polyurethane.

8. The current sensor device of claim 1, wherein the dielectric breakdown voltage of the material from which the electrically insulating non-gaseous medium is formed is equal to or greater than 1 kilovolts per millimeter (kV/mm), 5 kV/mm, 10 kV/mm, or 20 kV/mm.

9. The current sensor device of claim 1, wherein the material from which the electrically insulating non-gaseous medium is formed has a magnetic susceptibility equal to or less than 0.1, 0.01, 0.001, or 0.0001.

10. The current sensor device of claim 1, wherein the electrically insulating non-gaseous medium completely covers the side wall of the semiconductor chip.

11. The current sensor device of claim 1, wherein a portion of the conductor forms part of a bottom surface of the cavity.

12. The current sensor device of claim 11, wherein the portion of the conductor and a bottom surface the casing define a common plane.

13. The current sensor device of claim 1, further comprising:
an insulating member arranged between the conductor and the semiconductor chip.

14. The current sensor device of claim 13, wherein a material from which the insulating member is formed is a glass, a semiconductor oxide or nitride material, a cellulose, a polyimide, a ceramic, or a plastic material.

15. The current sensor device of claim 1, further comprising:
a lid to close the cavity.

16. The current sensor device of claim 15, wherein the lid comprises a hole.

17. A current sensor device, comprising:
a conductor;
a cavity formed in the conductor;
a semiconductor chip arranged at least partly in the cavity,
the semiconductor chip including a magnetic field sensitive element that is electrically insulated from the conductor; and
an electrically insulating non-gaseous medium to prevent a voltage breakdown or a partial discharge on a part of a side wall of the semiconductor chip covered by the electrically insulating non-gaseous medium,
the electrically insulating non-gaseous medium at least partially filling the cavity, and
the electrically insulating non-gaseous medium being formed of a material that has a greater dielectric breakdown voltage than a dielectric breakdown voltage of material from which the conductor is formed.

18. The current sensor device of claim 17, further comprising:
an insulating member that extends over a portion of the conductor to form a bottom surface of the cavity.

19. A method, comprising:
providing a casing having a cavity and a conductor fixedly mounted to the casing;
disposing a semiconductor chip into the cavity,
wherein the semiconductor chip includes a magnetic field sensitive element that is electrically insulated from the conductor; and
introducing a pourable material into the cavity to form an electrically insulating medium that at least partially fills the cavity,
the electrically insulating medium being formed to prevent a voltage breakdown or a partial discharge on a part of a sidewall of the semiconductor chip covered by the electrically insulating medium, and
the electrically insulating medium having a greater dielectric breakdown voltage than a dielectric breakdown voltage of a material from which the casing is formed.

20. The method of claim 19, wherein providing the casing comprises:
molding an integral plastic part to form the casing.

21. The method of claim 19, wherein providing the casing comprises:
providing a base part forming a bottom of the cavity; and
mounting a frame part on the base part,
the frame part forming a side wall of the cavity.

22. The method of claim 19, wherein introducing the pourable material into the cavity comprises dispensing a liquid, spraying the liquid, pouring the liquid, pouring solid particles, showering the liquid, or showering the solid particles.

23. The method of claim 19, wherein providing the casing comprises:
   providing a sheet-like base part structure;
   mounting an array of frame parts on the sheet-like base part structure; and
   singulating the sheet-like base part structure and the array of frame parts into single casings.

24. The method of claim 23, further comprising:
   attaching a lid foil on top of the array of frame parts before the singulating.

* * * * *